United States Patent [19]

Taneya et al.

[11] Patent Number: 4,791,651
[45] Date of Patent: Dec. 13, 1988

[54] SEMICONDUCTOR LASER ARRAY DEVICE

[75] Inventors: Mototaka Taneya, Nara; Mitsuhiro Matsumoto; Sadayoshi Matsui, both of Tenri, all of Japan

[73] Assignee: Sharp Kabushiki Kaisha, Osaka, Japan

[21] Appl. No.: 52,686

[22] Filed: May 20, 1987

[30] Foreign Application Priority Data

May 30, 1986 [JP] Japan .................. 61-126725

[51] Int. Cl.⁴ ............................... H01S 3/19
[52] U.S. Cl. ....................... 372/50; 372/46; 372/48
[58] Field of Search .............. 372/50, 48, 45, 96, 372/46

[56] References Cited

FOREIGN PATENT DOCUMENTS

| 064339 | 11/1982 | European Pat. Off. |
| 174839 | 3/1986 | European Pat. Off. |
| 3528089 | 2/1986 | Fed. Rep. of Germany |
| 0162088 | 9/1983 | Japan ................... 372/48 |
| 0004192 | 1/1984 | Japan ................... 372/48 |

Primary Examiner—William L. Sikes
Assistant Examiner—Georgia Y. Epps
Attorney, Agent, or Firm—Ciotti & Murashige, Irell & Manella

[57] ABSTRACT

A semiconductor laser array device comprising an active layer, a plurality of lasing filaments for laser oscillation, a refractive-index guiding structure constituting said lasing filaments, and a striped electrode structure constituting a current path, the width of which is narrower than the overall width of said lasing filaments.

3 Claims, 4 Drawing Sheets

SEMICONDUCTOR LASER ARRAY DEVICE

BACKGROUND OF THE INVENTION

1. Field of the Invention

This invention relates to a semiconductor laser array device which oscillates laser light in a 0° phase-shift mode up to a high output power.

2. Description of the Prior Art

Semiconductor laser devices which are useful as light sources for optical discs, laser printers, optical measuring systems, etc., must produce high output power. However, conventional semiconductor laser devices having a single waveguide structure can only produce low output power, 60–70 mW at their best, even taking into account their window effects and/or the reflectivity control at their facets. In order to oscillate laser light in a certain array mode (i.e., a 0° phase-shift mode, resulting in a single narrow beam with higher output power), semiconductor laser array devices, in which a plurality of waveguides are fabricated in a parallel manner to achieve an optical phase-coupling between the adjacent waveguides, have been studied. However, the optical phase-shift between the adjacent waveguides of these devices is, indeed, 180°, and output power light is emitted in a two-beam fashion having a certain angle therebetween, resulting in a far-field pattern having two peaks. Thus, this laser light cannot be condensed into a diffraction limited spot by means of any known optical lens. In order to use these semiconductor laser array devices as light sources for optical discs, laser printers, etc., they must oscillate laser in a single array mode and emit output power light with a single beam.

FIGS. 4 and 5 show a conventional semiconductor laser array device, which can be produced as follows: On the (001) plane of a p-GaAs substrate 101, an n+-$Al_{0.1}Ga_{0.9}As$ current blocking layer 102 having a thickness of 0.7 μm and an n-GaAs surface-protective layer 103 having a thickness of 0.1 μm are successively formed by liquid phase epitaxy. Then, three straight channels 108 are formed in a parallel manner through both the surface-protective layer 103 and the current blocking layer 102 into the p-GaAs substrate 101. Each of the channels 108 has a width of 4 μm and a depth of about 1 μm. The distance from the center of one channel to that of the adjacent channel is 5 μm. These channels 108 are disposed at right angles to the (110) plane which corresponds to each of the facets of the device. Then, on the n-GaAs surface-protective layer 103 including the channels 108, a p-$Al_{0.42}Ga_{0.58}As$ cladding layer 104 having a thickness of 0.2 μm in the portions to the outside of the channels 108, a p- or n- $Al_{0.14}Ga_{0.86}As$ active layer 105 having a thickness of 0.08 μm, an n-$Al_{0.42}Ga_{0.58}As$ cladding layer 106 having a thickness of 1.2 μm and an n+-GaAs contact layer 107 having a thickness of 1.5 μm are successively formed by liquid phase epitaxy. Since the channels 108 are filled with the p-cladding layer 104, the surface of each of the layers 104, 105, 106 and 107 is flat. Then, the upper face of the contact layer 107 and the back face of the substrate 101 are subjected to a vapor deposition treatment with metallic materials and then heated to form ohmic contacts thereon made of alloys of the metallic materials, followed by cleaving at the (110) plane of the wafer, resulting in a conventional semiconductive laser array device.

The optical field distribution of beams oscillated by the conventional laser array device and the far-field pattern attained by the conventional laser array device are shown in FIGS. 6 and 7, respectively, indicating that the optical phase-shift between the adjacent waveguides is 180°.

The reason why the conventional semiconductor laser array device having a plurality of waveguides is operated in 180° phase-shift mode is that laser light is absorbed by the optical coupling area between the adjacent waveguides, which makes threshold gain of the 180° phase-shift mode significantly low.

The above-mentioned phenomenon that the conventional laser array device is operated in a 180° phase-shift mode can be also explained by reference to FIG. 8, which shows the dependence of the threshold gain of all possible array modes ($v=1$, 2 and 3) of a triple lasing filament array on the difference in the refractive index in the lateral direction. This dependence is obtained by a calculation analysis of the waveguides. It can be also seen from FIG. 8 that the conventional laser array device selectively and stably oscillates laser light in a 180° phase-shift mode. As mentioned above, such a 180° phase-shift mode attains a far-field pattern having two peaks, which causes difficulty in condensing the laser light into a diffraction limited spot by means of any known optical lens.

Moreover, the conventional laser array device oscillates laser light in an array mode other than the 0° phase-shift mode and the 180° phase-shift mode, thereby producing output light with a plurality of beams. In addition, two or more array modes are mixed without interference therebetween, thereby producing output light with broad beams.

A semiconductor laser array device having an effective index-guided structure in which optical loss in the optical coupling area is zero has been proposed, which is shown in FIG. 9. The production of this laser array device is as follows: On the (001) plane of a p-GaAs substrate 111, an n-$Al_xGa_{1-x}As$ cladding layer 112 having a thickness of 0.8 μm, an n- or p-$Al_yGa_{1-y}As$ active layer 113 having a thickness of 0.1 μm, an n-$Al_xGa_{1-x}As$ cladding layer 114 having a thickness of 0.8 μm, and a p+-GaAs contact layer 115 having a thickness of 0.1 μm are successively formed by a crystal growth technique such as metal organic-chemical vapor deposition (MOCVD), molecular beam epitaxy (MBE), liquid phase epitaxy (LPE), or the like. Then, ohmic contacts are formed on both sides of the wafer. Three mesa-stripes 116 are then formed in a parallel manner in the wafer by photolithography and a reactive ion-beam etching technique in such a manner that the portion of the n-cladding layer 114 corresponding to the outside of the mesa-stripes 116 has a thickness of 0.3 μm. Each of the mesa-stripes 116 has a width of 3 μm and a height of 1.5 μm. The distance from the center of one mesa-stripe to that of the adjacent mesa-stripe is 4 μm. These mesa-strips 116 are disposed in the <110> direction of the substrate 111. Then, cleavage is carried out in the (110) plane of the wafer to form a laser array device 117 having a cavity length of about 250 μm.

The oscillation transverse mode attained by this effective-index guided laser array device is composed of a plurality of array modes. This phenomenon can be explained as follows: This effective-index guided laser array device oscillates laser light in all possible array modes simultaneously because the absorption of light in the optical coupling area does not occur and all of the possible array modes have the same threshold gain, whereas the laser array device shown in FIG. 4 selectively oscillates laser light in a 180° phase-shift mode because laser light is significantly absorbed by the optical coupling area. The breadth of output beams produced by this laser array device which oscillates laser light in a plurality of array modes is several times that of the limited diffraction value, which causes difficulty in the practical use of the laser array device.

As mentioned above, the conventional semiconductor laser array devices oscillate laser in a plurality of array modes, resulting in output light with two or more beams, which causes difficulty in the practical use of the laser array device as light sources in optical systems of laser printers, optical files, etc.

SUMMARY OF THE INVENTION

The semiconductor laser array device of this invention, which overcomes the above-discussed and numerous other disadvantages and deficiencies of the prior art, comprises an active layer, a plurality of lasing filaments for laser oscillation, a refractiveindex guiding structure constituting said lasing filaments, and a striped electrode structure constituting a current path, the width of which is narrower than the overall width of said lasing filaments.

In a preferred embodiment, the striped electrode structure is positioned corresponding to the center of the lasing region.

In a preferred embodiment, the lasing filaments are formed within the active layer corresponding to a plruality of channels composed of main portions and branching portions.

Thus, the invention described herein makes possible the objects of (1) providing a semiconductor laser array device which attains a single 0° phase-shift mode oscillation to the extent of a high output power level; and (2) providing a semiconductor laser array device having a striped electrode structure by which the current distribution in the said laser array device corresponds to the optical field distribution in a 0° phase-shift mode, thereby attaining synchronous oscillation in a 0° phase-shift mode.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
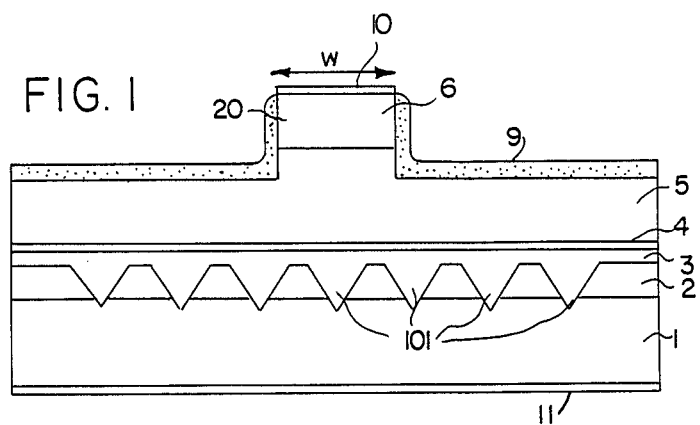
FIG. 1 is a cross sectional view showing a semiconductor laser array device of this invention.
Figure 2:
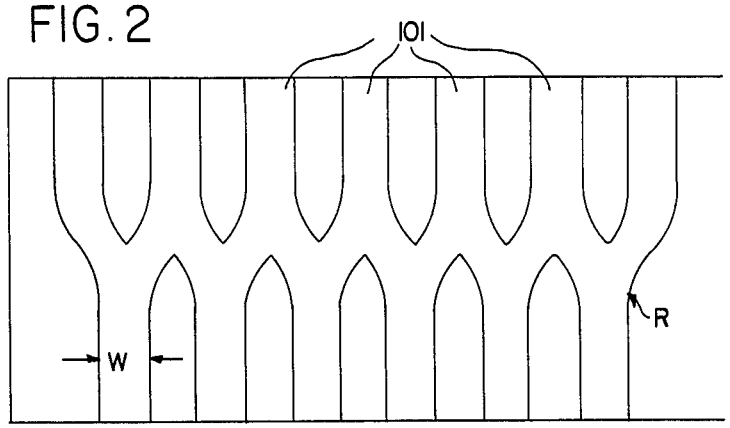
FIG. 2 is a plane view showing the substrate of the semiconductor laser array device shown in FIG. 1.

FIG. 1 shows a semiconductor laser array device of this invention, which can be produced as follows: On the (001) plane of a p-GaAs substrate 1, an n-GaAs current blocking layer 2 having a thickness of 0.8 $\mu$m is grown by liquid phase epitaxy (LPE), organic-metal vapor phase epitaxy (OM-VPE), molecular beam epitaxy (MBE), or the like. Then, a plurality of channels 101 composed of main portions and branching portions are formed in the wafer by photolithography and an etching technique to reach the p-GaAs substrate 1 through the current blocking layer 2. Each of the channels 101 has a width W of 4 $\mu$m and a depth of 1.0 $\mu$m. The pitch from the center of one channel to the adjacent channel is 5 $\mu$m. The radius of curvature of the border between each of the main portions and the adjacent branching portion is set at a certain value, e.g., 500 $\mu$m, at which optical loss in the border therebetween is negligible. The overall width of these channels is 34 $\mu$m. Then, on the substrate 1 including the channels 101, a p-$Al_xGa_{1-x}As$ cladding layer 3 having a thickness of 0.2 $\mu$m in the portions corresponding to the outside of the channels 101, a p- or n- $Al_yGa_{1-y}As$ active layer 4 having a thickness of 0.08 $\mu$m, an n-$Al_xGa_{1-x}As$ cladding layer 5 having a thickness of 0.8 $\mu$m, and an n+-GaAs contact layer 6 having a thickness of 0.5 $\mu$m are successively grown by liquid phase epitaxy (where x>y). The p-$Al_xGa_{1-x}As$ cladding layer 3 is grown under the condition that the channels 101 are completely filled with the p-$Al_xGa_{1-x}As$ cladding layer 3, so that the surface of the active layer 4 becomes flat over the entire area thereof. The form of the lasing filaments that are created within the active layer corresponding to the channels 101 corresponds to that of the channels 101 shown in FIG. 2.

Then, an electrode 10 having a width w is formed on the wafer in the direction that is parallel to the lasing filaments, and the portions of the wafer corresponding to the outside of the electrode 10 are etched by photolithography and a reactive ion-beam etching technique in such a manner that the portion of the n-cladding layer 5 corresponding to the outside of the mesa-stripe 20 has a thickness of 0.5 $\mu$m, resulting in a meas-stripe 20 with a width w that is narrower than the overall width, 34 $\mu$m, of the lasing filaments. The mesa-stripe 20 is positioned at the portion of the cladding layer 5 corresponding to the position of the central lasing filament. Then, as $Si_3N_4$ film 9 having a thickness of 2500 Å is formed on the wafer by plasma assisted chemical vapor deposition (P-CVD), followed by the formation a hole through which the electrode 10 is exposed outside. The back face of the substrate 1 of the wafer is lapped to adjust the thickness of the wafer to about 100 $\mu$m. The wafer is then cleaved to form a laser array device having a cavity length of about 250 $\mu$m.

Since the laser array device has the above-mentioned structure, the width of each current path is contracted by the n-GaAs current blocking layer 2 and the mesa-stripe 20 with a width w. That is, the lasing filaments are formed into a pattern such as that of the channels 101 shown in FIG. 2. On the other hand, current injected to the laser array device is contracted by the mesa-stripe 20, which causes the injection of a large amount of carrier into the lasing filaments in the center area of the device and the injection of a relatively small amount of carrier into the lasing filaments in both side areas. This phenomenon corresponds to the oscillation array mode (i.e., the supermode) in a 0° phase-shift mode, so that this laser array device can attain oscillation in a 0° phase-shift mode up to a high output power.

Figure 3:
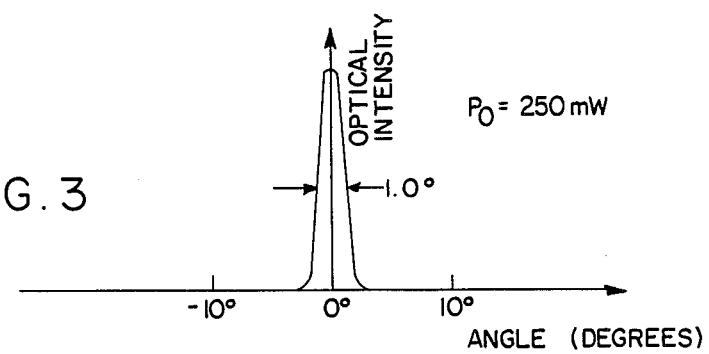
FIG. 3 is a graph showing the far-field pattern attained by the semiconductor laser array device shown in FIG. 1.
Figure 4:
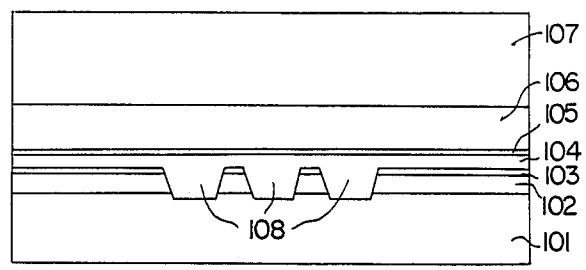
FIG. 4 is a front view showing a conventional semiconductor laser array device.
Figure 5:
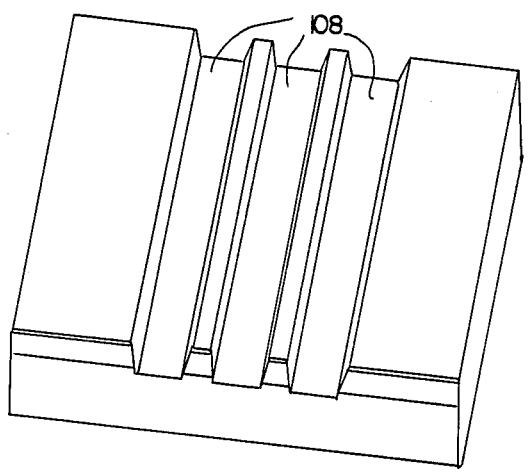
FIG. 5 is a perspective view showing a wafer of the conventional semiconductor laser array device shown in FIG. 4.
Figure 6:
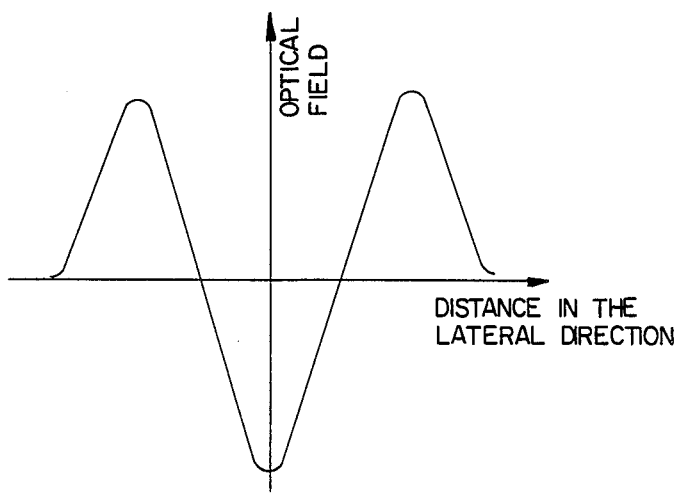
FIG. 6 is a graph showing the optical field distribution of the conventional semiconductor laser array device shown in FIG. 4.
Figure 7:
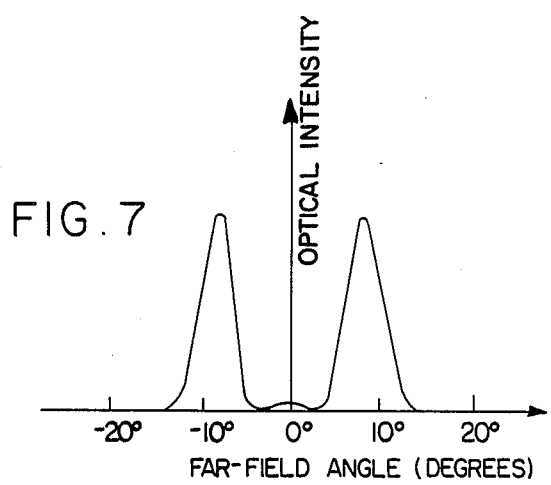
FIG. 7 is a graph showing the far-field pattern attained by the conventional semiconductor laser array device shown in FIG. 4.
Figure 8:
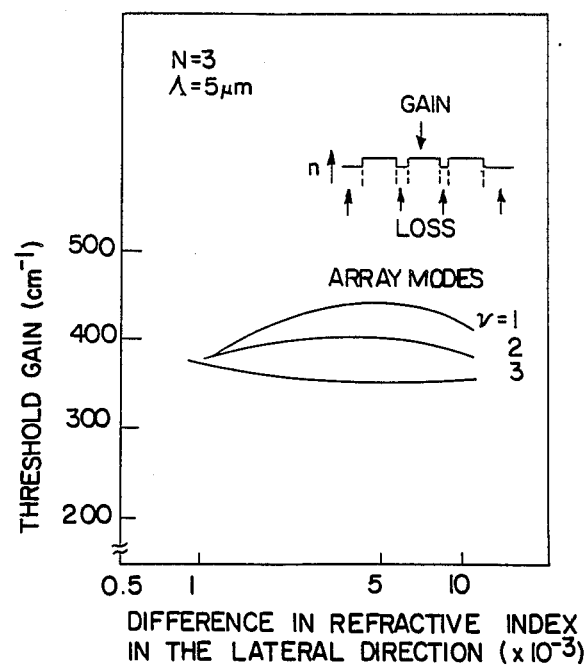
FIG. 8 is a graph showing the theoretical analysis of the array mode threshold gain of the conventional semiconductor laser array device shown in FIG. 4.
Figure 9:
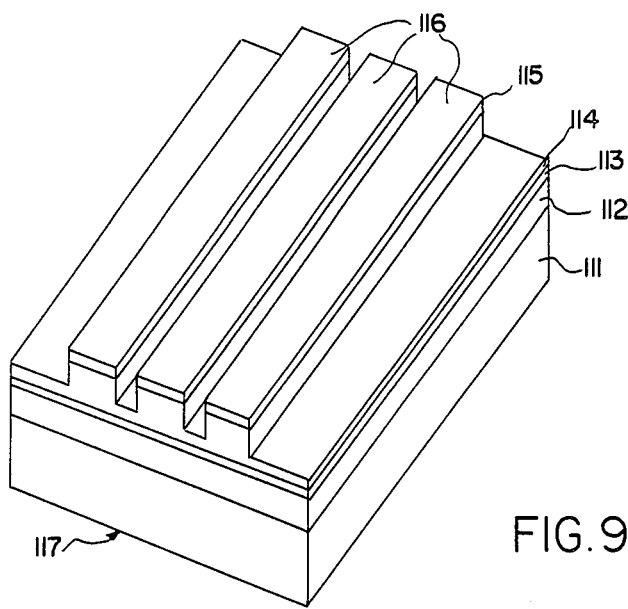
FIG. 9 is a perspective view showing another conventional semiconductor laser array device.

The laser array device of the above-mentioned example can produce an output power of as high as 250 mW with a single diffraction limited beam corresponding to a 0° phase-shift mode. The far-field pattern attained by this laser array device under the condition of $P_0=250$ mW is shown in FIG. 3, exhibiting a single peak at the 0° position, wherein the half-width lobe at full maximum is 1.0° that is nearly equal to the limited diffraction value.

This invention is not limited to the abovementioned example, but it is, of course, applicable to devices having a current blocking structure different from that of the above-mentioned example, devices having a lasing filament structure different from that of the above-mentioned example, devices using semiconductor materials therein different from those of the above-mentioned example, devices having a polarity different from that of the above-mentioned example, and devices in which the current blocking structure and the lasing filament structure are different from those of the above-mentioned example in that they are exchanged for each other.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array device comprising a substrate and an active layer in which a plurality of lasing filaments for laser oscillation is formed by a refractive-index guiding structure, a striped electrode structure constituting a current path is formed on the top of said device, the width of said striped electrode structure being narrower than the overall width of said lasing filaments.

2. A semiconductor laser array device according to claim 1, wherein said striped electrode structure is positioned along and above the center line of the lasing region constituted by said lasing filaments.

3. A semiconductor laser array device according to claim 2, wherein said lasing filaments are formed within said active layer corresponding to a plurality of channels which are formed on said substrate and composed of main portions and branching portions.

* * * * *